(12) United States Patent
Wessendorf

(10) Patent No.: US 10,483,912 B1
(45) Date of Patent: Nov. 19, 2019

(54) NON-INVERTING MULTI-MODE OSCILLATOR

(71) Applicant: National Technology & Engineering Solutions of Sandia, LLC, Albuquerque, NM (US)

(72) Inventor: Kurt O. Wessendorf, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 120 days.

(21) Appl. No.: 15/707,541

(22) Filed: Sep. 18, 2017

Related U.S. Application Data

(60) Provisional application No. 62/396,598, filed on Sep. 19, 2016.

(51) Int. Cl.
*H03B 5/36* (2006.01)

(52) U.S. Cl.
CPC ....... *H03B 5/36* (2013.01); *H03B 2200/0004* (2013.01); *H03B 2200/0012* (2013.01); *H03B 2200/0034* (2013.01); *H03B 2202/05* (2013.01)

(58) Field of Classification Search
CPC . H03B 5/32; H03B 5/36; H03B 5/362; H03B 5/364; H03B 5/38; H03B 2200/0004; H03B 2200/0012; H03B 2200/0034
See application file for complete search history.

(56) References Cited

U.S. PATENT DOCUMENTS

| 4,376,918 | A  | * | 3/1983  | Masuda ............... H03K 3/3545 331/116 FE |
| 6,169,460 | B1 | * | 1/2001  | Wordelman ............ H03B 5/30 331/116 R |
| 7,852,167 | B2 | * | 12/2010 | Makuta .................. H03B 5/362 331/108 D |

OTHER PUBLICATIONS

Lacoste, "Robert Lacoste's The Darker Side: Practical Applications for Electronic Design Concepts from Circuit Cellar", 2010, Chapter 9, pp. 143-145 (Year: 2010).*

(Continued)

*Primary Examiner* — Ryan Johnson
(74) *Attorney, Agent, or Firm* — Samantha Updegraff; Mark A. Dodd

(57) ABSTRACT

Various technologies described herein pertain to non-inverting multi-mode oscillators. An oscillator circuit can include a non-inverting sustaining amplifier and a feedback network. The non-inverting sustaining amplifier includes an amplifier input and an amplifier output. The feedback network includes a crystal, an input portion, and an output portion. The crystal of the feedback network can be connected between the amplifier input and the amplifier output of the non-inverting sustaining amplifier. The input portion of the feedback network can be connected between the amplifier input and ground, and can include an inductor realized using a tank circuit. Further, the output portion of the feedback network can be connected between the amplifier output and ground, and can include a capacitor. Moreover, the crystal can operate in series resonance mode or parallel resonance mode.

13 Claims, 7 Drawing Sheets

(56) References Cited

OTHER PUBLICATIONS

"Specifying Quartz Crystals", Tutorial 726, Maxim Integrated, Nov. 19, 2001, pp. 1-6.
Cerda, Ramon, "Pierce-Gate Crystal Oscillator, An Introduction", Feature Article, Mar. 2008, pp. 1-3.
"Theory of Operation", Oscillator, Fox Electronics, 2004, pp. 107-109.
Raza, Syed, "Understanding the Basics of the Pierce Oscillator", Electronic Products, Crystals and Oscillators, Jul. 2011, pp. 1-2.

* cited by examiner

NON-INVERTING MULTI-MODE OSCILLATOR

RELATED APPLICATION

This application claims priority to U.S. Provisional Patent Application No. 62/396,598, filed on Sep. 19, 2016, entitled "NON-INVERTING MULTI-MODE (NIMM) OSCILLATOR", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Pierce oscillators are a commonly used type of oscillator circuit. For instance, a Pierce oscillator circuit can include a single inverting amplifier, a crystal, and two capacitors, where the crystal acts as a highly frequency dependent reactance element. The crystal and the two capacitors form a very high Q tank circuit, which provides a phase shift and gain from an output of the inverting amplifier to an input of the inverting amplifier at approximately the resonant frequency of the crystal. The crystal operates inductive at the frequency of oscillation, where an impedance is determined by the passive elements; thus, the operating impedance is $>+j0\Omega$. For instance, the operating impedance of the crystal can approximately equal to a sum of the magnitudes of the impedances of the two capacitors.

In conventional Pierce oscillators, the inverting nature of the signals across the crystal can cause significant drive voltages across the crystal. However, the crystal may be sensitive to the drive voltage. Accordingly, accuracy of these conventional oscillator circuits can be detrimentally impacted due to relatively high drive levels across the crystal. Moreover, some crystals may be damaged if operated at these relative high drive levels.

SUMMARY

Described herein are various technologies that pertain to non-inverting multi-mode oscillators. An oscillator circuit can include a non-inverting sustaining amplifier and a feedback network. The non-inverting sustaining amplifier includes an amplifier input and an amplifier output. The feedback network includes a crystal, an input portion, and an output portion. The crystal of the feedback network can be connected between the amplifier input and the amplifier output of the non-inverting sustaining amplifier. The input portion of the feedback network can be connected between the amplifier input and ground, and can include an inductor. Further, the output portion of the feedback network can be connected between the amplifier output and ground, and can include a capacitor. Moreover, the crystal can operate in series resonance mode or parallel resonance mode.

According to various examples, an integrated circuit can include the non-inverting sustaining amplifier of the oscillator circuit, while the feedback network can be separate from the integrated circuit. Pursuant to other examples, the oscillator circuit can be formed of discrete components; thus, instead of the non-inverting sustaining amplifier being part of an integrated circuit, the non-inverting sustaining amplifier can include discrete components.

According to an example, an integrated circuit can include the non-inverting sustaining amplifier. Following this example, the non-inverting sustaining amplifier can include an input resistor, a first inverter, a first feedback resistor, a second inverter, and a second feedback resistor. The input resistor can be connected between the amplifier input of the non-inverting sustaining amplifier and a first internal node of the non-inverting sustaining amplifier. The first inverter can be directly connected between the first internal node and a second internal node of the non-inverting sustaining amplifier. Further, the first feedback resistor can be directly connected between the first internal node and the second internal node. The second inverter can be directly connected between the second internal node and the amplifier output of the non-inverting sustaining amplifier. Moreover, the second feedback resistor can be directly connected between the second internal node and the amplifier output. Further following this example, the non-inverting sustaining amplifier can be connectable to a feedback network comprising a crystal.

Pursuant to another example, a circuit can include the feedback network. The feedback network can include the crystal, the input portion that includes the inductor, and the output portion that includes the capacitor. The crystal is directly connected between a first node and a second node of the feedback network. Further, the input portion is directly connected between the first node and ground, and the output portion is directly connected between the second node and ground. Moreover, the feedback network of the circuit can be connectable to a non-inverting sustaining amplifier such that the non-inverting sustaining amplifier is connectable between the first node and the second node of the feedback network.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
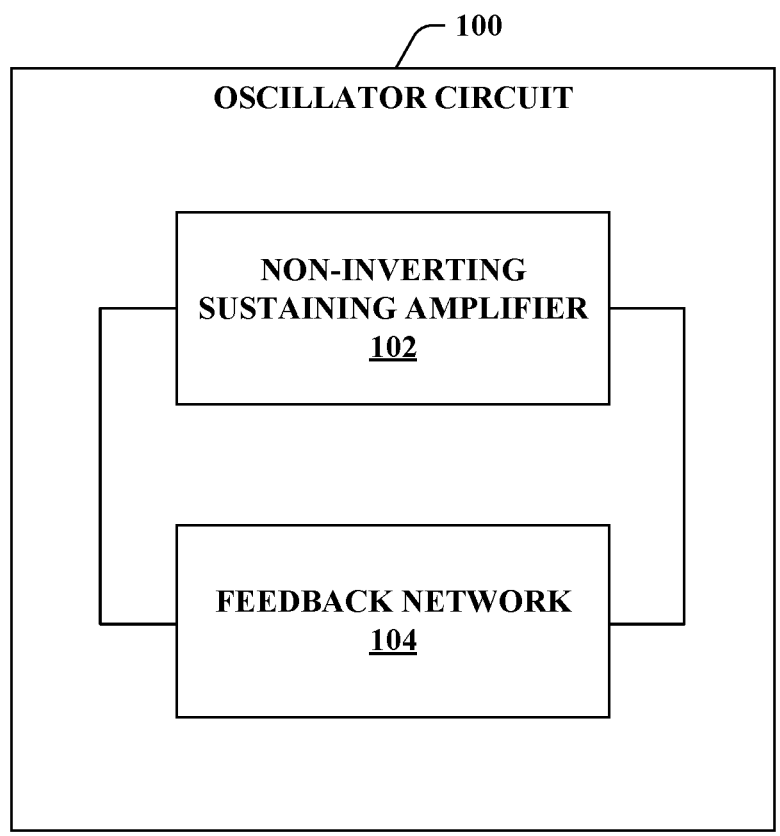
FIG. 1 illustrates a functional block diagram of an exemplary non-inverting multi-mode oscillator circuit.

Various technologies pertaining to non-inverting multi-mode oscillators are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the term "directly connected between" is intended to mean that terminals of a particular component are electrically connected to given nodes without any other component included as part of a path between the given nodes along with the particular component. The particular component is directly connected between the given nodes when the particular component is part of a path between the given nodes, where a first terminal of the particular component is electrically connected to a first one of the given nodes, a second terminal of the particular component is electrically connected to a second one of the given nodes, and no intermediary node exists along the path. Thus, when the particular component is directly connected between the given nodes, no other component is in series with the particular component between the given nodes. By way of illustration, a resistor being directly connected between a node A and a node B is intended to mean that a first terminal of the resistor is electrically connected to the node A and a second terminal of the resistor is electrically connected to the node B.

The term "connected between" is intended to encompass both a particular component being directly connected between given nodes and the particular component being part of a path between the given nodes such that one or more other components are also part of the path between the given nodes. When connected between given nodes, the particular component is part of a path between the given nodes that may include one or more intermediary nodes. According to an example, when connected between the given nodes, the particular component can be part of a path between the given nodes that includes a maximum of two intermediary nodes. In accordance with another example, when connected between the given nodes, the particular component can be part of a path between the given nodes that includes a maximum of one intermediary node. Pursuant to an illustration, a resistor being connected between a node A and a node B is intended to include the resistor being directly connected between the node A and the node B as well as configurations such as a first terminal of the resistor being electrically connected to the node A, a second terminal of the resistor being electrically connected to an intermediary node C, a first terminal of a capacitor being electrically connected to the intermediary node C, and a second terminal of the capacitor being electrically connected to the node B.

Moreover, it is to be appreciated that any component described herein can be replaced by an equivalent network of components. For instance, resistors, capacitors, or inductors described herein can be replaced by equivalent resistive, capacitive, or inductive networks.

Referring now to the drawings, FIG. 1 illustrates an exemplary oscillator circuit 100. The oscillator circuit 100 is a non-inverting multi-mode oscillator. The oscillator circuit 100 includes a non-inverting sustaining amplifier 102 and a feedback network 104.

The non-inverting sustaining amplifier 102 is a non-inverting transconductance amplifier. Accordingly, an input voltage is inputted to the non-inverting sustaining amplifier 102 and an output current is outputted from the non-inverting sustaining amplifier 102. The feedback network 104 selects a part of an output waveform from an amplifier output of the non-inverting sustaining amplifier 102 and returns the selected part of the output waveform to an amplifier input of the non-inverting sustaining amplifier 102. The feedback network 104 includes a resonator. For example, the resonator included in the feedback network 104 can be a crystal. While many of embodiments set forth herein describe the resonator being a crystal, it is contemplated that other types of resonators in addition to or instead of a crystal can be included in the feedback network 104; thus, for instance, it is contemplated that the crystal in various embodiments described herein can be replaced by a different type of resonator. In accordance with an example, the oscillator circuit 100 can be designed to operate at frequencies on the order of 10s of MHz; however, the claimed subject matter is not so limited.

According to an example, an integrated circuit can include the non-inverting sustaining amplifier 102 of the oscillator circuit 100. Following this example, the feedback network 104 can be separate from the integrated circuit (e.g., the non-inverting sustaining amplifier 102 can be on chip and the feedback network 104 can be off chip). For instance, an application-specific integrated circuit (ASIC) can include the non-inverting sustaining amplifier 102, and the feedback network 104 can be separate from, but electrically connected to, the ASIC including the non-inverting sustaining amplifier 102.

Pursuant to another example, the oscillator circuit 100 can include discrete components. Thus, rather than the non-inverting sustaining amplifier 102 being part of an integrated circuit, the non-inverting sustaining amplifier 102 can include discrete components. Following this example, the feedback network 104 can also include discrete components.

Figure 2:
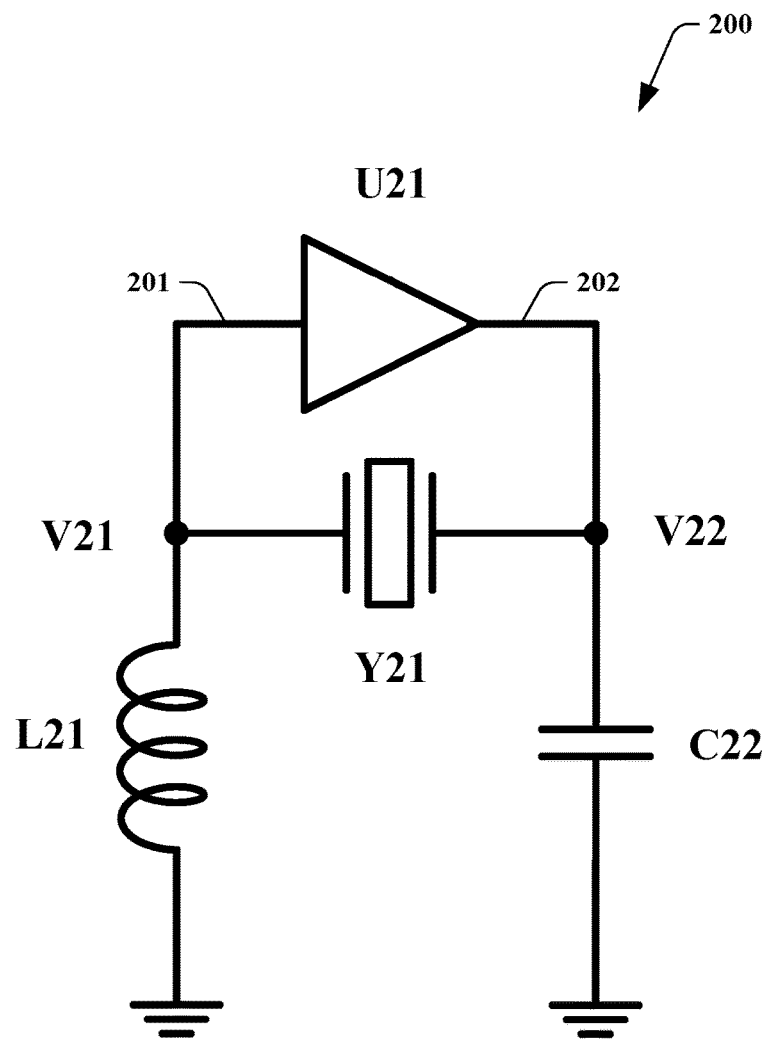
FIG. 2 illustrates a circuit diagram of an exemplary non-inverting multi-mode oscillator circuit.

Turning to FIG. 2, illustrated is a circuit diagram of an exemplary oscillator circuit 200 (e.g., the oscillator circuit 100 of FIG. 1). The oscillator circuit 200 is a non-inverting multi-mode oscillator. The oscillator circuit 200 includes a non-inverting sustaining amplifier U21 (e.g., the non-inverting sustaining amplifier 102 of FIG. 1), which includes an amplifier input 201 and an amplifier output 202. Moreover, the oscillator circuit 200 includes a feedback network (e.g., the feedback network 104 of FIG. 1) connected to the non-inverting sustaining amplifier U21. The feedback network includes a crystal Y21, an input portion, and an output portion. The crystal Y21, for instance, can be an AT cut crystal. While many of the examples set forth herein describe the feedback network including a crystal (such as the crystal Y21), as noted above it is contemplated that the feedback network can include other types of resonators in addition to or instead of a crystal; thus, for instance, it is to be appreciated that the crystal can be replaced by a different type of resonator in various embodiments described herein.

The crystal Y21 of the feedback network is connected between the amplifier input 201 and the amplifier output 202 of the non-inverting sustaining amplifier U21. Moreover, the input portion of the feedback network is connected between the amplifier input 201 and ground; the input portion of the feedback network includes an inductor L21. Further, the output portion of the feedback network is connected between the amplifier output 202 and ground, and the output portion includes a capacitor C22.

Due to the use of the non-inverting sustaining amplifier U21, the inductor L21 as an input inductance to ground, the capacitor C22 as an output capacitance to ground, and a high Q resonator (namely, the crystal Y21) as a feedback element, the oscillator circuit 200 will oscillate with the condition of the reactance of the crystal Y21 to be approximately equal to $+j(|X_{C2}|-|X_{L1}|)$. $|X_{C2}|$ is the magnitude of the impedance of the capacitor of the output portion of the feedback network (e.g., the capacitor C22 in FIG. 2) and $|X_{L1}|$ is the magnitude of the impedance of the inductor of the input portion of the feedback network (e.g., the inductor L21 in FIG. 2) at the frequency of the resonator. Oscillation will occur in this manner since the resonator (the crystal Y21) is the high Q frequency determining element in the oscillator circuit 200. Moreover, the operating impedance of the crystal Y21 is $\geq +j0\Omega$.

The crystal Y21 can operate in series resonance mode or parallel resonance mode. Whether the crystal Y21 operates in series resonance mode or parallel resonance mode can be based on component value selection. Thus, the crystal Y21 can operate in series resonance mode or parallel resonance mode as a function of a magnitude of an impedance of the inductor L21 of the input portion of the feedback network and a magnitude of an impedance of the capacitor C22 of the output portion of the feedback network. Given the conditions for oscillation set forth above, if $|X_{C2}|>|X_{L1}|$, then the crystal Y21 will be operating as an inductive reactance and therefore be in parallel resonance mode of operation. Alternatively, if $|X_{C2}|\approx|X_{L1}|$, then the crystal Y21 will be operating with $\sim j0\Omega$ reactance and therefore be in series resonance mode of operation. Accordingly, the crystal Y21 can operate in series resonance mode when the magnitude of the impedance of the inductor L21 matches (e.g., approximately equals) the magnitude of the impedance of the capacitor C22. Alternatively, the crystal Y21 can operate in parallel resonance mode when the magnitude of the impedance of the inductor L21 differs from the magnitude of the impedance of the capacitor C22. Thus, the crystal Y21 can operate in parallel resonance mode when not operating in series resonance mode. Further, the choice of mode of operation can depend upon the type of resonator being used (e.g., resonator cut) or preference of resonator manufacturing speciation.

Moreover, power dissipation in the crystal Y21 can be low relative to power dissipated in a crystal of a conventional Pierce oscillator circuit. The lower power dissipation in the crystal Y21 in relation to a conventional Pierce oscillator circuit is due to the non-inverting sustaining amplifier U21. A voltage drop across the crystal Y21, which equals V22-V21, can be low even though an input waveform at the amplifier input 201 and an output waveform at the amplifier output 202 can be large (e.g., the input waveform and the output waveform can each be rail to rail waveforms). More particularly, the voltage drop across the crystal Y21 can be relatively low since the input waveform and the output waveform are in the same phase. In contrast, a voltage drop across a crystal of a typical Pierce oscillator circuit tends to be significantly higher due to an input waveform and an output waveform being out of phase.

Figure 3:
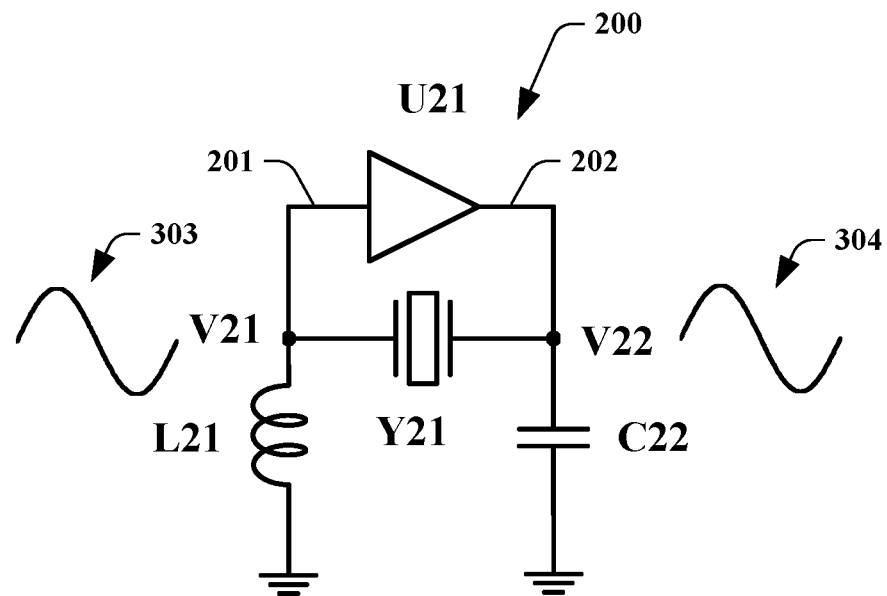
FIG. 3 illustrates a comparison of the oscillator circuit of FIG. 2 to a conventional Pierce oscillator circuit.
Figure 3:
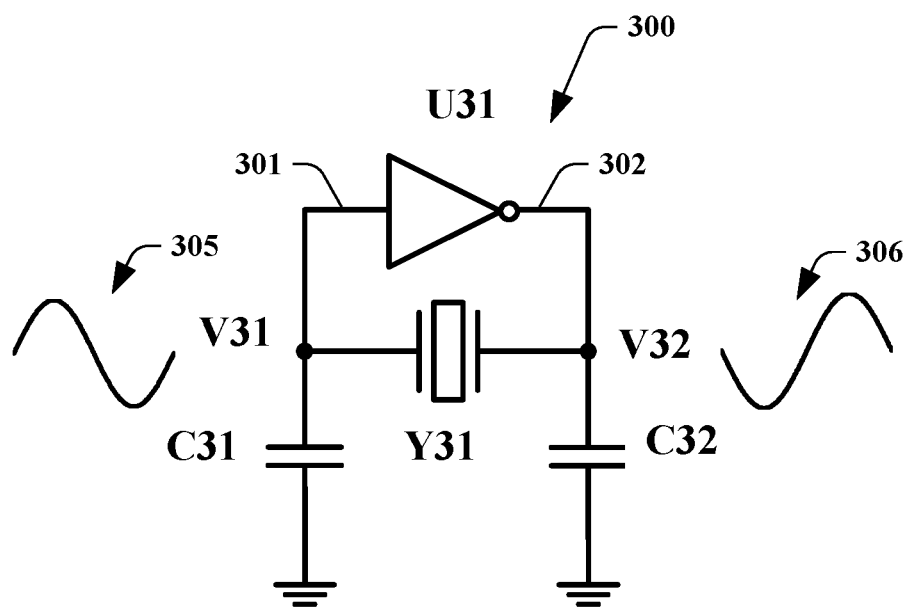

Now turning to FIG. 3, illustrated is a comparison of the oscillator circuit 200 to a conventional Pierce oscillator circuit 300. As illustrated, the Pierce oscillator circuit 300 can include an inverting amplifier U31 and a feedback network. The feedback network of the Pierce oscillator circuit 300 includes a crystal Y31 connected between an amplifier input 301 of the inverting amplifier U31 and an amplifier output 302 of the inverting amplifier U32, a capacitor C31 connected between the amplifier input 301 and ground, and a capacitor C32 connected between the amplifier output 302 and ground.

FIG. 3 depicts an input waveform 303 and an output waveform 304 of the oscillator circuit 200 as well as an input waveform 305 and an output waveform 306 of the Pierce oscillator circuit 300. Since the oscillator circuit 200 includes the non-inverting sustaining amplifier U21 having a non-inverting transconductance, the output waveform 304 of the oscillator circuit 200 is not inverted relative to the input waveform 303 of the oscillator circuit 200. Due to the non-inversion between the input waveform 303 and the output waveform 304, a drive voltage across the crystal Y21, which equals V22-V21, is low (relative to a drive voltage across the crystal Y31 of the Pierce oscillator circuit 300). In comparison, the Pierce oscillator circuit 300 includes the inverting amplifier U31 having an inverting transconductance. Thus, the output waveform 306 of the Pierce oscillator circuit 300 is inverted relative to the input waveform 305 of the Pierce oscillator circuit 300. Phase inversion between the input waveform 305 and the output waveform 306 leads to a drive voltage across the crystal Y31, which equals V32-V31, being relative high (as compared to the drive voltage across the crystal Y21 of the oscillator circuit 200). According to an example, if capacitances of the capacitor C31 and the capacitor C32 of the Pierce oscillator circuit 300 are equal, then amplitudes of the input waveform 305 and the output waveform 306 are equal; however, the input waveform 305 and the output waveform 306 have opposite phases, leading to the large drive voltage across the crystal Y31 (e.g., twice the amplitude of the waveforms).

Figure 4:
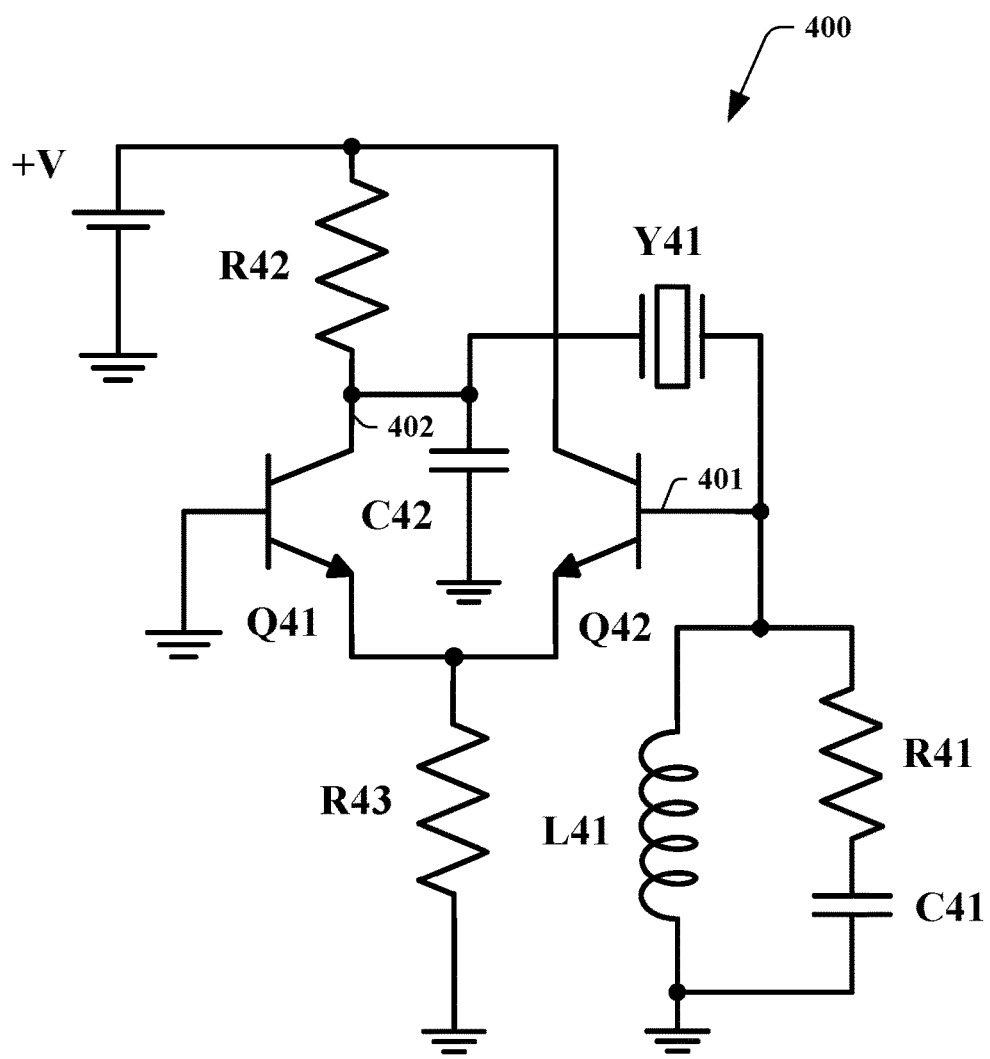
FIG. 4 illustrates a circuit diagram of an exemplary bipolar transistor differential amplifier oscillator circuit.

With reference to FIG. 4, illustrated is an exemplary bipolar transistor differential amplifier oscillator circuit 400 (e.g., the oscillator circuit 100 of FIG. 1). An alternating current (AC) representation of the oscillator circuit 400 is depicted in FIG. 4, with some bias circuits not shown. Again, the oscillator circuit 400 is a non-inverting multi-mode oscillator. In the example set forth in FIG. 4, the non-inverting sustaining amplifier (e.g., the non-inverting sustaining amplifier 102 of FIG. 1) is a bipolar transistor differential amplifier. The bipolar transistor differential amplifier can include a transistor Q41 (an NPN bipolar transistor), a transistor Q42 (an NPN bipolar transistor), a resistor R42, and a resistor R43. A base of the transistor Q41 is grounded and an amplifier input 401 of the non-inverting sustaining amplifier is at a base of the transistor Q42. Emitters of the transistor Q41 and the transistor Q42 are electrically connected to each other as well as a first terminal of the resistor R43, with a second terminal of the resistor R43 being grounded. Moreover, an amplifier output 402 of the non-inverting sustaining amplifier is at a collector of the transistor Q41. A first terminal of the resistor R42 is also connected to the collector of the transistor Q41. Moreover, a second terminal of the resistor R42 and a collector of the transistor Q42 are connected to a positive supply rail +V. Non-inverting transconductance is provided by the transistor Q41, the transistor Q42, the resistor R42, and the resistor R43. Thus, an output waveform at the amplifier output 402 is not inverted relative to an input waveform at the amplifier input 401.

The oscillator circuit 400 also includes a feedback network (e.g., the feedback network 104 of FIG. 1) connected to the non-inverting sustaining amplifier. Similar to above, the feedback network includes a crystal Y41, an input portion, and an output portion. The crystal is connected between the amplifier input 401 and the amplifier output 402. Moreover, the input portion of the feedback network is connected between the amplifier input 401 and ground, and includes an inductor L41. The output portion of the feedback network is connected between the amplifier output 402 and ground, and includes a capacitor C42 (e.g., the capacitor C42 is directly connected between the amplifier output 402 and ground).

In the exemplary oscillator circuit 400, the inductor L41 of the input portion of the feedback network is directly connected between the amplifier input 401 and ground. Further, the input portion of the feedback network can be a tank circuit as depicted in FIG. 4. For instance, the input portion of the feedback network can include a tank circuit capacitor C41. The tank circuit capacitor C41 and the inductor L41 are part of separate, parallel paths between the amplifier input 401 and ground; thus, the tank circuit capacitor C41 and the inductor L41 are each connected between the amplifier input 401 and ground. In the example of FIG. 4, the input portion of the feedback network also includes a tank circuit resistor R41; the tank circuit resistor R41 and the tank circuit capacitor C41 are connected in series between the amplifier input 401 and ground.

The tank circuit (L41, R41, and C41) is inductive at a desired frequency. The tank circuit allows removal of parasitic oscillation through shunt capacitance of the crystal Y41. An inductor has a parallel shunt capacitance and therefore a parallel resonance above the desired use impedance and frequency. This parallel resonance can allow a parasitic oscillation because of the resonator shunt capacitance. The tank circuit of the input portion is designed to be a relatively high Q inductor at the desired frequency and a poor parallel resonant impedance above this frequency to disallow the undesired parasitic oscillation. Moreover, in the example shown in FIG. 4, gain controlled through the resistors R42 and R43 also allows control of undesired parasitic oscillation through the shunt capacitance of the crystal Y41.

Figure 5:
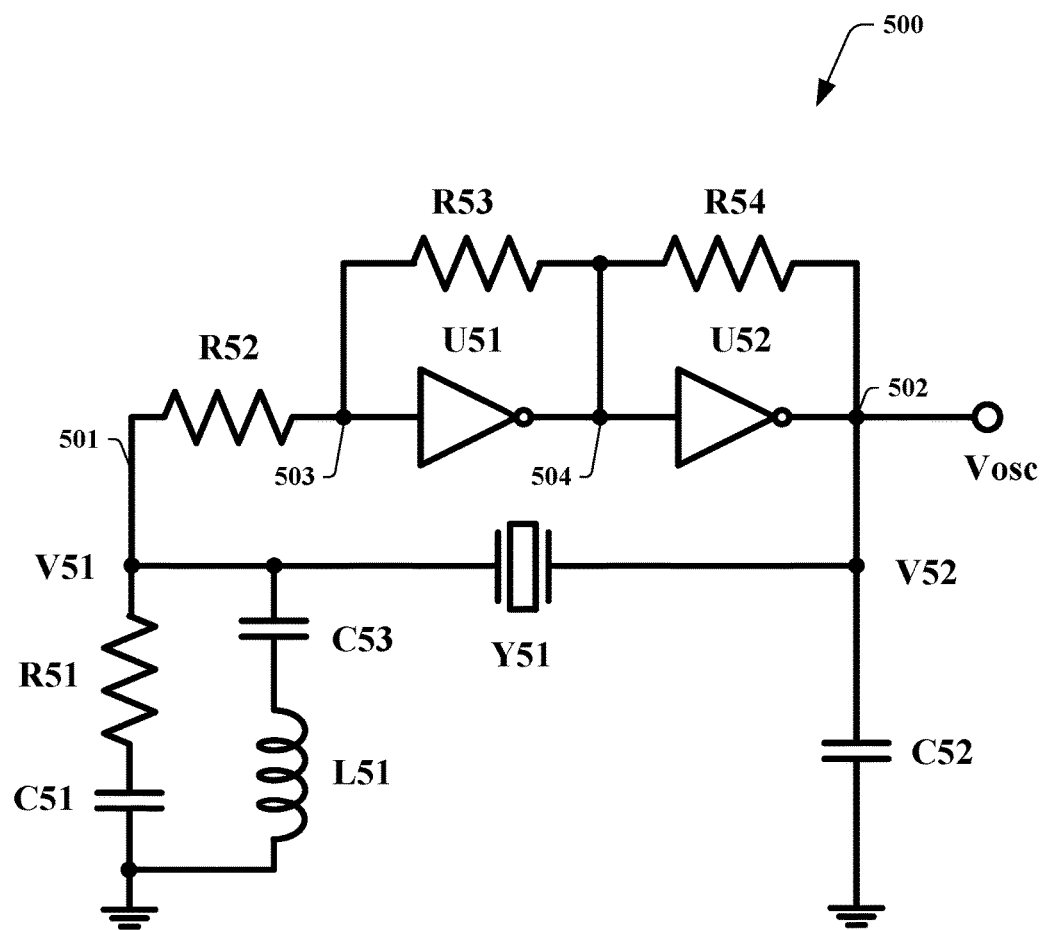
FIG. 5 illustrates a circuit diagram of another exemplary non-inverting multi-mode oscillator circuit.

Now referring to FIG. 5, illustrated is another exemplary non-inverting multi-mode oscillator circuit 500 (e.g., the oscillator circuit 100 of FIG. 1). Similar to above, the oscillator circuit 500 includes a non-inverting sustaining amplifier (e.g., the non-inverting sustaining amplifier 102 of FIG. 1) and a feedback network (e.g., the feedback network 104 of FIG. 1). According to an example, an integrated circuit can include the non-inverting sustaining amplifier of the oscillator circuit 500, while the feedback network can be separate from the integrated circuit.

The non-inverting sustaining amplifier of the oscillator circuit 500 has an amplifier input 501 and an amplifier output 502. Moreover, the non-inverting sustaining amplifier of the oscillator circuit 500 can include an input resistor R52, a first inverter U51, a first feedback resistor R53, a second inverter U52, and a second feedback resistor R54. The first inverter U51 and the second inverter U52 can be complementary metal-oxide-semiconductor (CMOS) inverters. The first inverter U51 and the second inverter U52 can be single stage CMOS inverters, for instance. The input resistor R52 can be connected between the amplifier input 501 and a first internal node 503 of the non-inverting sustaining amplifier. The first inverter U51 can be directly connected between the first internal node 503 and a second internal node 504 of the non-inverting sustaining amplifier. The first feedback resistor R53 can also be directly connected between the first internal node 503 and the second internal node 504. The second inverter U52 can be directly connected between the second internal node 504 and the amplifier output 502. The second feedback resistor R54 can additionally be directly connected between the second internal node 504 and the amplifier output 502.

Moreover, the feedback network again includes a crystal Y51, an input portion, and an output portion. The crystal Y51 is connected between the amplifier input 501 and the amplifier output 502. Further, the input portion of the feedback network is connected between the amplifier input 501 and ground, and includes an inductor L51 (e.g., the inductor L51 is connected between the amplifier input 501 and ground). The output portion of the feedback network is connected between the amplifier output 502 and ground, and includes a capacitor C52 (e.g., the capacitor C52 is directly connected between the amplifier output 502 and ground).

Similar to FIG. 4, the input portion of the feedback network of the oscillator circuit 500 can be a tank circuit. Thus, the input portion of the feedback network can include a tank circuit capacitor C51 in addition to the inductor L51, each of which are connected between the amplifier input 501 and ground. The tank circuit capacitor C51 and the inductor L51 can be part of separate, parallel paths between the amplifier input 501 and ground. In the example of FIG. 5, the input portion of the feedback network also includes a tank circuit resistor R51 and a blocking capacitor C53. The tank circuit resistor R51 and the tank circuit capacitor C51 are connected in series between the amplifier input 501 and ground. Moreover, the blocking capacitor C53 and the inductor L51 are connected in series between the amplifier input 501 and ground; yet, it is contemplated that the blocking capacitor C53 need not be included in the input portion of the feedback network in other embodiments.

Similar to FIG. 4, the tank circuit (L51, R51, and C51) of the input portion of the feedback network of the oscillator circuit 500 is inductive at a desired frequency. Moreover, the tank circuit allows removal of parasitic oscillation through shunt capacitance of the crystal Y51. Further, gain and input impedance of the first inverter U51 and the second inverter U52 can be controlled through the resistors R52, R53, and R54, which also allows control of undesired parasitic oscillation through the shunt capacitance of the crystal Y51. The first feedback resistor R53 can bias the first inverter U51, and the second feedback resistor R54 can bias the second inverter U52.

The non-inverting sustaining amplifier of the oscillator circuit 500 (the input resistor R52, the first inverter U51, the first feedback resistor R53, the second inverter U52, and the second feedback resistor R54) provides finite resistive feedback to control the shunt impedance across the tank circuit of the input portion of the feedback network. If a signal from the tank circuit of the input portion at a parallel resonance of the tank circuit is too high, a non-desired parasitic oscillation can occur due to this and the shunt capacitance of the crystal Y51. Moreover, the non-inverting sustaining amplifier of the oscillator circuit 500 controls gain, which can also allow the crystal Y51 to control the oscillation and minimize parasitic oscillation through the shunt capacitance of the crystal Y51.

The non-inverting sustaining amplifier of the oscillator circuit 500 includes two stages: stage 1 includes the input resistor R52, the first inverter U51, and the first feedback resistor R53, and stage 2 includes the second inverter U52 and the second feedback resistor R54. In stage 1, the gain can roughly be −R53/R52 and can have an input impedance of Z~R52. Thus, this stage can be controllable and reproducible in that it is controlled by passive resistors given that the first inverter U51 has significant gain.

Stage 2 of the non-inverting sustaining amplifier of the oscillator circuit 500 has finite and relatively real input impedance of Z~R54/$A_v$, where $A_v$ is the gain of the second inverter U52; the second feedback resistor R54 can be relatively large (e.g., >10 kΩ, depending upon the crystal type and frequency) as to maintain a relatively high output impedance. The second feedback resistor R54 can allow the second inverter U52 to bias to enable operation of the oscillator circuit 500.

The two stages of the non-inverting sustaining amplifier (which include the first inverter U51 and the second inverter U52) in combination can provide a non-inverting transconductance. Moreover, the resistors R52, R53, and R54 can be fabricated on an integrated circuit along with the inverters U51 and U52. Further, since significant gain may be detrimental and two inverters U51 and U52 are used to provide the non-inverting transconductance, the feedback technique employed in the non-inverting sustaining amplifier of the oscillator circuit 500 allows gain and input impedance control.

Figure 6:
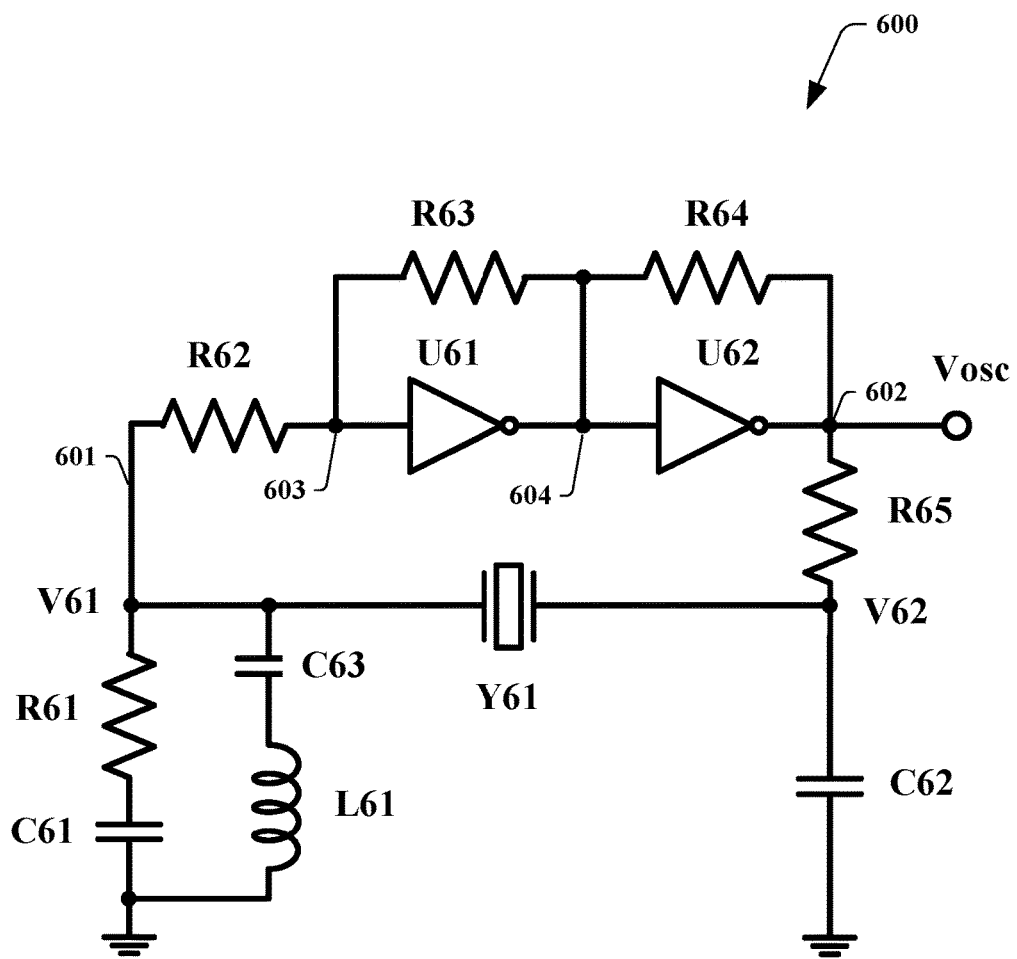
FIG. 6 illustrates a circuit diagram of yet another exemplary non-inverting multi-mode oscillator circuit.

With reference to FIG. 6, illustrated is yet another exemplary non-inverting multi-mode oscillator circuit 600 (e.g., the oscillator circuit 100 of FIG. 1). Again, the oscillator circuit 600 includes a non-inverting sustaining amplifier (e.g., the non-inverting sustaining amplifier 102 of FIG. 1) and a feedback network (e.g., the feedback network 104 of FIG. 1). For example, an integrated circuit can include the non-inverting sustaining amplifier of the oscillator circuit 600, while the feedback network can be separate from the integrated circuit.

Similar to the oscillator circuit 500, the non-inverting sustaining amplifier of the oscillator circuit 600 (having an amplifier input 601 and an amplifier output 602) can include an input resistor R62, a first inverter U61, a first feedback resistor R63, a second inverter U62, and a second feedback resistor R64. The input resistor R62 can be connected between the amplifier input 601 and a first internal node 603 of the non-inverting sustaining amplifier. The first inverter U61 can be directly connected between the first internal node 603 and a second internal node 604 of the non-inverting sustaining amplifier. The first feedback resistor R63 can also be directly connected between the first internal node 603 and the second internal node 604. The second inverter U62 can be directly connected between the second internal node 604 and the amplifier output 602. The second feedback resistor R64 can additionally be directly connected between the second internal node 604 and the amplifier output 602.

The feedback network again includes a crystal Y61, an input portion, and an output portion. The crystal Y61 is connected between the amplifier input 601 and the amplifier output 602. Further, the input portion of the feedback network is connected between the amplifier input 601 and ground, and includes an inductor L61 (e.g., the inductor L61 is connected between the amplifier input 601 and ground). The output portion of the feedback network is connected between the amplifier output 602 and ground, and includes a capacitor C62 (e.g., the capacitor C62 is connected between the amplifier output 602 and ground).

The input portion of the feedback network of the oscillator circuit 600 can be a tank circuit. In the example of FIG. 6, similar to above with respect to FIG. 5, the tank circuit can include a tank circuit capacitor C61 and a tank circuit resistor R61 in addition to the inductor L61. Like above as described in FIG. 5, the input portion of the feedback network can also include blocking capacitor C63.

The oscillator circuit 600 further includes an isolation resistor R65. The isolation resistor R65 is connected between the amplifier output 602 and the crystal Y61. The isolation resistor R65 is a series output resistance, which can reduce power to the crystal Y61. Thus, power dissipation in the crystal Y61 can be lowered by the isolation resistor R65 (relative to a similarly configured oscillator circuit that lacks the isolation resistor R65 such as the oscillator circuit 500 of FIG. 5, V62-V61 can be lower than V52-V51 assuming the only difference between the oscillator circuits of FIGS. 5 and 6 is the inclusion of the isolation resistor R65 in the oscillator circuit 600). Moreover, the isolation resistor R65 can further mitigate parasitic frequency (through the shunt capacitance of the crystal Y61) due to the gain and phase-change introduced outside of the primary operating frequency by the addition of this resistor R65.

Reference is now generally made to FIGS. 5-6. Pursuant to an example, an integrated circuit can include the non-inverting sustaining amplifier of the oscillator circuit 500 or the oscillator circuit 600. The integrated circuit can include the input resistor (R52 or R62), the first inverter (U51 or U62), the first feedback resistor (R53 or R63), the second inverter (U52 or U62), and the second feedback resistor (R54 or R64). Following this example, the non-inverting sustaining amplifier can be connectable to a feedback network that includes a crystal.

Moreover, it is contemplated that the integrated circuit that includes the non-inverting sustaining amplifier can further include the isolation resistor R65, for example. Thus, a first terminal of the isolation resistor R65 can be electrically connected to the amplifier output 602, and the feedback network can be connectable between a second terminal of the isolation resistor R65 and the amplifier input 601. Yet, according to another example, it is to be appreciated that the isolation resistor R65 can be separate from the integrated circuit (assuming that the isolation resistor R65 is included as part of the oscillator circuit).

Pursuant to yet a further example (as shown below in FIG. 7), it is contemplated that the integrated circuit that includes the non-inverting sustaining amplifier can also include a blocking capacitor. Pursuant to this example, the blocking capacitor and the input resistor can be connected in series between the amplifier input and the first internal node of the non-inverting sustaining amplifier.

In accordance with yet another example, a circuit can include the feedback network of the oscillator circuit 500 or the oscillator circuit 600. Following this example, the feedback network can include the crystal, the input portion, and the output portion. The crystal of the feedback network can be directly connected between a first node and a second node. Moreover, the input portion can be directly connected between the first node and ground, where the input portion includes the inductor (L51 or L61). It is contemplated that the input portion can also include a tank circuit capacitor (C51 or C61); the tank circuit capacitor and the inductor are each connected between the first node and ground such that the tank circuit capacitor and the inductor are part of separate, parallel paths between the first node and ground. Further, the output portion can be directed connected between the second node and ground, where the output portion includes the capacitor (C52 or C62). Accordingly, the feedback network can be connectable to a non-inverting sustaining amplifier (e.g., which can be on chip) such that the non-inverting sustaining amplifier is connectable between the first node and the second node of the feedback network.

Figure 7:
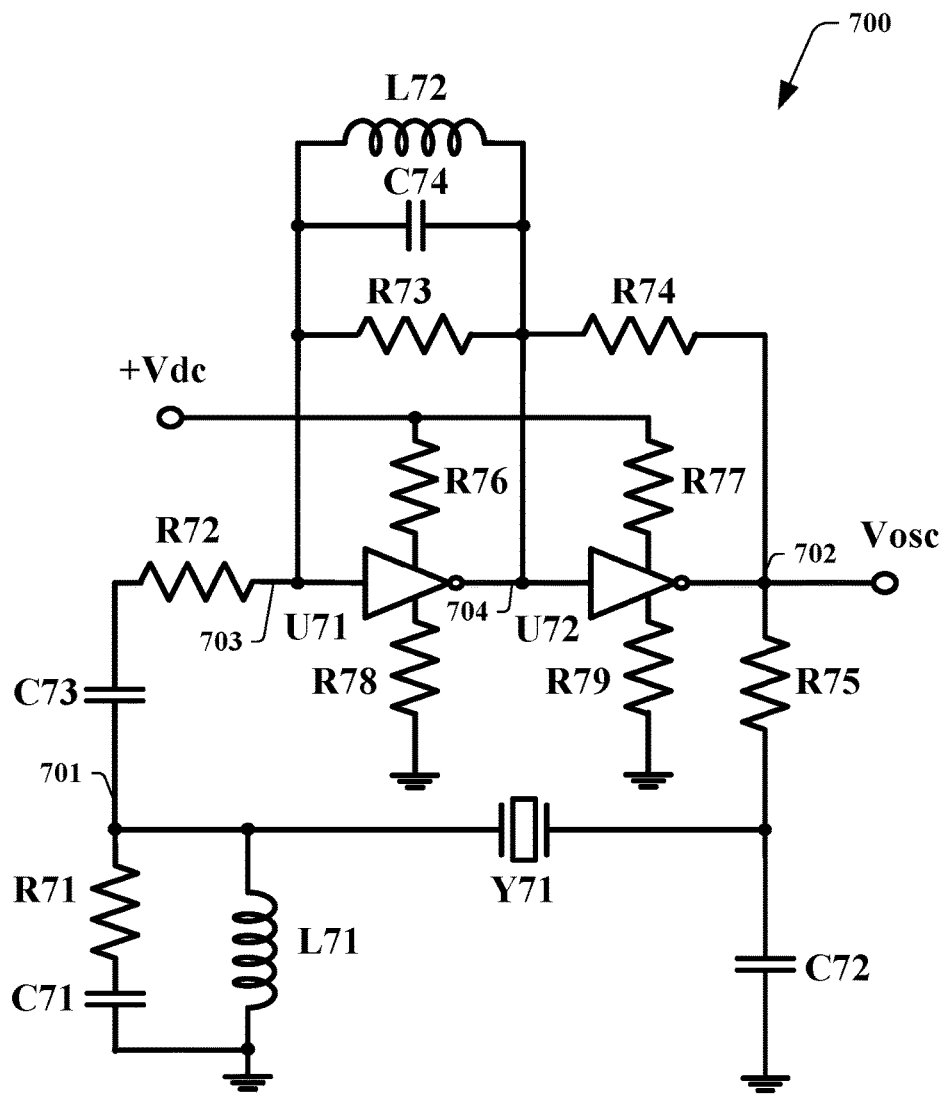
FIG. 7 illustrates a circuit diagram of still another exemplary non-inverting multi-mode oscillator circuit.

Turning to FIG. 7, illustrated is still another exemplary non-inverting multi-mode oscillator circuit 700 (e.g., the oscillator circuit 100 of FIG. 1). The oscillator circuit 700 again includes a non-inverting sustaining amplifier (e.g., the non-inverting sustaining amplifier 102 of FIG. 1) and a feedback network (e.g., the feedback network 104 of FIG. 1). According to an example, the components of the oscillator circuit 700 can be discrete components (e.g., the non-inverting sustaining amplifier and the feedback network can both be formed of discrete components).

The non-inverting sustaining amplifier of the oscillator circuit 700 (having an amplifier input 701 and an amplifier output 702) can include an input resistor R72, a first inverter U71, a first feedback resistor R73, a second inverter U72, and a second feedback resistor R74. It is contemplated that the first inverter U71 and the second inverter U72 can be discrete CMOS inverters or inverters made from discrete MOS devices; yet, the claimed subject matter is not so limited.

The input resistor R72 can be connected between the amplifier input 701 and a first internal node 703 of the non-inverting sustaining amplifier. In the example shown in FIG. 7, the non-inverting sustaining amplifier can also include a blocking capacitor C73; the blocking capacitor C73 and the input resistor R72 are connected in series between the amplifier input 701 and the first internal node 703. Moreover, the first inverter U71 can be directly connected between the first internal node 703 and a second internal node 704 of the non-inverting sustaining amplifier. The first feedback resistor R73 can also be directly connected between the first internal node 703 and the second internal node 704. The second inverter U72 can be directly connected between the second internal node 704 and the amplifier output 702. The second feedback resistor R74 can additionally be directly connected between the second internal node 704 and the amplifier output 702. Gain and impedance of the first inverter U71 and the second inverter U72 can be controlled through the resistors R72, R73, and R74, which also allow control of undesired parasitic oscillation through shunt capacitance of a crystal Y71 of the feedback network.

The non-inverting sustaining amplifier of the oscillator circuit 700 can also include a feedback inductor L72 and a feedback capacitor C74. The feedback inductor L72 can be directly connected between the first internal node 703 and the second internal node 704. Moreover, the feedback capacitor C74 can be directly connected between the first internal node 703 and the second internal node 704. The feedback inductor L72 and the feedback capacitor C74 form a tank circuit that allows operation of a discrete circuit, such that capacitances around the first inverter U71 and part of the second inverter U72 can be tuned out.

Moreover, the non-inverting sustaining amplifier of the oscillator circuit 700 can include resistors R76, R77, R78, and R79. Resistors R76, R77, R78, and R79 can be chosen to decrease effective transconductances of the inverters U71 and U72.

The feedback network again includes a crystal Y71, an input portion, and an output portion. The crystal Y71 is connected between the amplifier input 701 and the amplifier output 702. Further, the input portion of the feedback network is connected between the amplifier input 701 and ground, and includes an inductor L71 (e.g., the inductor L71 is connected between the amplifier input 701 and ground). The output portion of the feedback network is connected between the amplifier output 702 and ground, and includes a capacitor C72 (e.g., the capacitor C72 is connected between the amplifier output 702 and ground).

In the example of FIG. 7, the input portion of the feedback network of the oscillator circuit 700 can include a tank circuit capacitor C71 and a tank circuit resistor C71 (similar to the tank circuits noted above). Moreover, the input portion shown in FIG. 7 lacks a blocking capacitor; instead, the blocking capacitor C73 is included as part of the non-inverting sustaining amplifier of the oscillator circuit 700. Further, the oscillator circuit 700 can include an isolation resistor R75 (similar to the isolation resistor R65 of FIG. 6).

Further, as used herein, the term "exemplary" is intended to mean "serving as an illustration or example of something."

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An oscillator circuit, comprising:
    a non-inverting sustaining amplifier, the non-inverting sustaining amplifier comprises an amplifier input and an amplifier output; and
    a feedback network, the feedback network comprises:
        a crystal, the crystal of the feedback network connected between the amplifier input and the amplifier output of the non-inverting sustaining amplifier;
        an input portion, the input portion connected between the amplifier input and ground, the input portion comprises an inductor, a tank circuit capacitor, and a tank circuit resistor, wherein the inductor forms a first path between the amplifier input and ground, and wherein the tank circuit capacitor and the tank circuit resistor are connected in series and form a second path between the amplifier input and ground, the second path being separate from but parallel to the first path; and
        an output portion, the output portion connected between the amplifier output and ground, the output portion comprises a capacitor.

2. The oscillator circuit of claim 1, wherein the inductor is directly connected between the amplifier input and ground.

3. The oscillator circuit of claim 1, the input portion further comprises:
    a blocking capacitor, the blocking capacitor and the inductor are connected in series between the amplifier input and ground.

4. The oscillator circuit of claim 1, wherein an integrated circuit comprises the non-inverting sustaining amplifier, and the feedback network is separate from the integrated circuit.

5. The oscillator circuit of claim 1, the non-inverting sustaining amplifier further comprises:
an input resistor, the input resistor connected between the amplifier input and a first internal node of the non-inverting sustaining amplifier;
a first inverter, the first inverter directly connected between the first internal node and a second internal node of the non-inverting sustaining amplifier;
a first feedback resistor, the first feedback resistor directly connected between the first internal node and the second internal node;
a second inverter, the second inverter directly connected between the second internal node and the amplifier output; and
a second feedback resistor, the second feedback resistor directly connected between the second internal node and the amplifier output.

6. The oscillator circuit of claim 5, the non-inverting sustaining amplifier further comprising:
a feedback inductor, the feedback inductor directly connected between the first internal node and the second internal node; and
a feedback capacitor, the feedback capacitor directly connected between the first internal node and the second internal node.

7. The oscillator circuit of claim 5, the non-inverting sustaining amplifier further comprising:
a blocking capacitor, the blocking capacitor and the input resistor are connected in series between the amplifier input and the first internal node.

8. The oscillator circuit of claim 1, further comprising:
an isolation resistor, the isolation resistor is connected between the amplifier output and the crystal.

9. The oscillator circuit of claim 1, wherein a magnitude of an impedance of the inductor matches a magnitude of an impedance of the capacitor such that the crystal operates in series resonance mode.

10. The oscillator circuit of claim 1, wherein a magnitude of an impedance of the inductor differs from a magnitude of an impedance of the capacitor such that the crystal operates in parallel resonance mode.

11. The oscillator circuit of claim 1, wherein the crystal operates in series resonance mode or parallel resonance mode as a function of a magnitude of an impedance of the inductor and a magnitude of an impedance of the capacitor.

12. A circuit, comprising:
a feedback network, the feedback network comprises:
a crystal, the crystal of the feedback network directly connected between a first node and a second node;
an input portion, the input portion directly connected between the first node and ground, the input portion comprises an inductor, a resistor, and a capacitor, wherein the resistor and the capacitor are connected in series between the first node and ground, wherein the inductor forms a separate, parallel path between the first node and ground; and
an output portion, the output portion directly connected between the second node and ground, the output portion comprises a capacitor;
wherein the feedback network is connectable to a non-inverting sustaining amplifier such that the non-inverting sustaining amplifier is connectable between the first node and the second node of the feedback network.

13. The circuit of claim 12, further comprising:
the non-inverting sustaining amplifier.

* * * * *